United States Patent
Chung et al.

(10) Patent No.: US 8,700,974 B2
(45) Date of Patent: Apr. 15, 2014

(54) MEMORY SYSTEM CONTROLLER HAVING SEED CONTROLLER USING MULTIPLE PARAMETERS

(75) Inventors: Jungsoo Chung, Seoul (KR); Hong Rak Son, Anyang-Si (KR); Junjin Kong, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/616,168

(22) Filed: Sep. 14, 2012

(65) Prior Publication Data

US 2013/0173989 A1   Jul. 4, 2013

(30) Foreign Application Priority Data

Dec. 28, 2011 (KR) .................. 10-2011-0144995

(51) Int. Cl.
*G11C 29/00* (2006.01)

(52) U.S. Cl.
USPC .......................................................... 714/763

(58) Field of Classification Search
CPC ... G06F 11/1008; G06F 2212/20; G06F 3/06; G06F 11/1044; G06F 11/1076; G06F 2213/16; G06F 7/584; H03M 13/05; G11C 7/1006
USPC ......... 714/763, 739, 761, 752, 710, 718, 728; 360/26, 36.1, 47, 52; 365/200, 201
See application file for complete search history.

(56) References Cited

U.S. PATENT DOCUMENTS 6,549,446 B2   4/2003  Morley et al.
8,301,912 B2 * 10/2012 Lin et al. .................. 713/193
2002/0001338 A1 *  1/2002 Schilling ................... 375/150
2004/0205352 A1 * 10/2004 Ohyama .................... 713/194
2005/0008151 A1 *  1/2005 Liang ........................... 380/37
2006/0103745 A1 *  5/2006 Nagaishi et al. ............ 348/294
2007/0253465 A1 * 11/2007 Muharemovic et al. ...... 375/130
2008/0151618 A1 *  6/2008 Sharon et al. ........... 365/185.02
2008/0215798 A1 *  9/2008 Sharon et al. ............... 711/103
2009/0089642 A1 *  4/2009 Miles et al. ................. 714/752
2009/0172266 A1    7/2009 Kimura
2009/0316490 A1 * 12/2009 Takada .................... 365/185.26
2009/0323942 A1 * 12/2009 Sharon et al. ................ 380/44
2010/0088574 A1 *  4/2010 Kim et al. ................... 714/763
2010/0165955 A1 *  7/2010 Park et al. ................... 370/337
2010/0217921 A1 *  8/2010 Mun ........................... 711/103
2010/0229007 A1 *  9/2010 Park ........................... 713/193
2011/0016263 A1 *  1/2011 Lin et al. .................... 711/103
2011/0032759 A1 *  2/2011 Kim et al. ............... 365/185.03
2011/0119432 A1 *  5/2011 Yoon .......................... 711/103
2011/0238891 A1 *  9/2011 Chen et al. .................. 711/103

FOREIGN PATENT DOCUMENTS

KR      1020100039647 A    4/2010

* cited by examiner

*Primary Examiner* — Albert Decady
*Assistant Examiner* — Osman Alshack
(74) *Attorney, Agent, or Firm* — Volentine & Whitt, PLLC (57) ABSTRACT

In a memory system, a memory controller includes a randomizer and a seed controller. The seed controller provides a seed to the randomizer and includes; a first register block performing a first cyclic shift operation using a first parameter related to the nonvolatile memory device, a second register block performing a second cyclic shift operation using a second parameter related to the nonvolatile memory device, and a seed generating block generating the seed from the first and second cyclic shift results.

16 Claims, 11 Drawing Sheets

MEMORY SYSTEM CONTROLLER HAVING SEED CONTROLLER USING MULTIPLE PARAMETERS

CROSS-REFERENCE TO RELATED APPLICATIONS

A claim of priority under 35 U.S.C §119 is made to Korean Patent Application No. 10-2011-0144995 filed Dec. 28, 2011, the subject matter of which is hereby incorporated by reference.

BACKGROUND

The inventive concept relates generally to seed controllers and operating methods for seed controllers. More particularly, the inventive concept relates to seed controllers and seed controller operating methods used in memory systems including nonvolatile memory device.

Programmed memory cells in contemporary nonvolatile memory devices are subject to many system and environmental influences capable of changing the data state of the memory cells. For example, in flash memory devices, memory cells may be collectively or respectively affected by program voltage disturbances, pass voltage disturbances, bit-line and/or word-line coupling effects, back pattern dependencies, etc. One or more of these "influences" may cause an undesired state change in a programmed memory cell.

It has been noted that randomized data stored in a memory cell array is less likely to be adversely affected by ill influences, as compared with patterned data (i.e., input data having a substantially non-random pattern of digital data values). Accordingly, input data is often randomized before being programmed to a nonvolatile memory cell array to improve data reliability.

One type of randomizer uses a so-called pseudo-noise (PN) sequence to randomize input data. A linear feedback shift register (LFSR) may be used to generate a PN sequence from an initial value called a "seed".

SUMMARY

Embodiments of the inventive concept are directed to provide a memory systems, memory controllers in memory systems, and seed controllers in memory controllers that generate a seed using a plurality of parameters related to a memory device. This approach improves the randomization of input data in both row-wise and columnar directions.

In one embodiment, the inventive concept provides a memory system including a memory controller and a non-volatile memory device. The memory controller comprises; a randomizer that receives a non-random input data pattern and converts the non-random input data pattern into a random input data pattern using a seed, wherein the randomizer comprises a plurality of linear feedback shift registers each receiving the seed, and a seed controller that provides the seed to the randomizer. The seed controller comprises; a first register block that performs a first cyclic shift operation using a first parameter related to the nonvolatile memory device to generate a first cyclic shift result, a second register block that performs a second cyclic shift operation using a second parameter related to the nonvolatile memory device to generate a second cyclic shift result, and a seed generating block generating the seed from the first and second cyclic shift results.

In another embodiment, the inventive concept provides a memory system comprising; a nonvolatile memory device, and a memory controller that receives non-random pattern input data from a host, generates random pattern input data from the non-random pattern input data, and stores the non-random pattern input data in the nonvolatile memory device. The memory controller comprises; a randomizer that converts the non-random input data pattern into the random input data pattern using a seed and comprises a plurality of linear feedback shift registers each receiving the seed, and a seed controller that provides the seed. The seed controller comprises; a first register block that performs a first cyclic shift operation using a first parameter related to the nonvolatile memory device to generate a first cyclic shift result, a second register block that performs a second cyclic shift operation using a second parameter related to the nonvolatile memory device to generate a second cyclic shift result, and a seed generating block generating the seed from the first and second cyclic shift results.

BRIEF DESCRIPTION OF THE DRAWINGS

The above and other objects and features of the inventive concept will become more apparent upon consideration of the following description with reference to the accompanying drawings.

DETAILED DESCRIPTION

The inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements and features.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
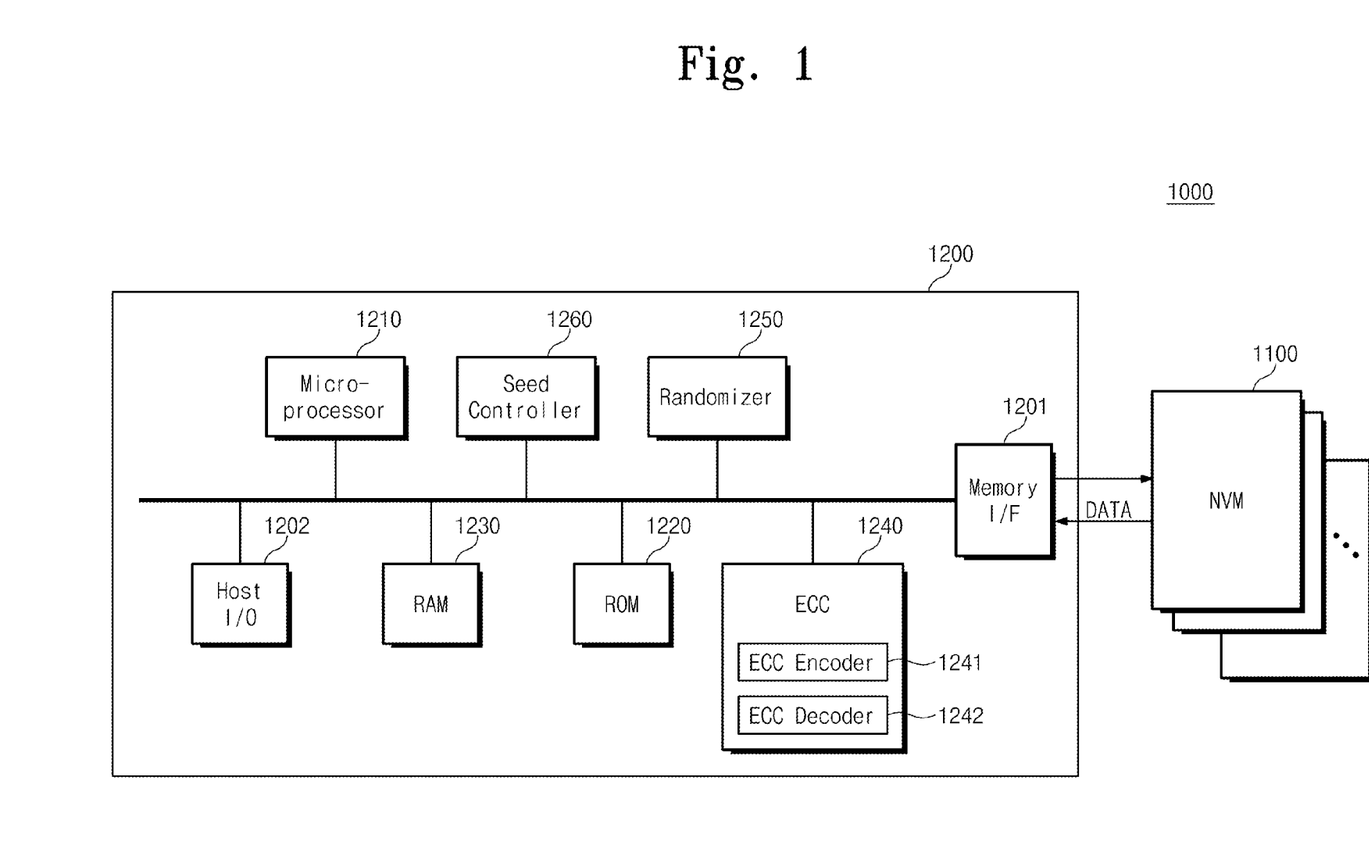
FIG. 1 is a block diagram of a memory system according to an embodiment of the inventive concept.

Figure (FIG.) 1 is a block diagram illustrating a memory system according to an embodiment of the inventive concept. Referring to FIG. 1, a memory system 1000 generally comprises a nonvolatile memory device 1100 and a memory controller 1200.

The nonvolatile memory device 1100 may include a flash memory, an Electrically Erasable Programmable Read-Only Memory (EEPROM), a Ferroelectrics Random Access Memory (FRAM), a Phase Change Random Access Memory (PRAM), a Magneto-resistive Random Access Memory (MRAM), and the like. The nonvolatile memory device 1100 may operate as a storage unit for data provided from the memory controller 1200.

In the illustrated embodiment of FIG. 1, the memory controller 1200 includes a memory interface 1201, a host input/output device 1202, a microprocessor 1210, a Random Access Memory (RAM) 1230, a Read Only Memory (ROM) 1220, an Error Correction Code (ECC) unit 1240, a randomizer 1250, and a seed controller 1260. The foregoing constituent elements of the memory controller 1200 may be electrically connected via a bus. In certain embodiments of the inventive concept, the randomizer 1250 of the memory controller 1200 may include a random sequence generator.

The memory interface (I/F) 1201 may be used to control an interface between the memory controller 1200 and nonvolatile memory device 1100. A command issued by the microprocessor 1210 may be sent to the nonvolatile memory device 1100 via the memory interface 1201, or data may be transferred to the nonvolatile memory device 1100 from the memory controller 1200 via the memory interface 1201.

The host input/output (I/O) device 1202 may be sued to control an interface between the memory system 1000 including the memory controller 1200 and a host (not shown) in accordance with one or more data communication protocols. For example, the host I/O device 1202 may communicate with the external host using a Universal Serial Bus (USB), Small Computer System Interface (SCSI), PCI express, ATA, Parallel ATA (PATA), Serial ATA (SATA), Serial Attached SCSI, and/or the like.

The microprocessor 1210 may be used to control the overall operation of the memory system 1000 including the memory controller 1200. When the memory system 1000 is powered-on, the microprocessor 1210 may load firmware stored in the ROM 1220 to the RAM 1230 to control operation of the memory system 1000. The microprocessor 1210 may be used to decode commands received from the host, and control the nonvolatile memory device 1100 in response to the decoded commands.

The ROM 1220 may be used to store driving firmware code for the memory system 1000. The firmware code can be stored at a nonvolatile memory device such as PRAM, ReRAM, MRAM, or the like instead of the ROM 1220. Control of the microprocessor 1210 may be accomplished by direct hardware control and/or firmware and/or software driven by the microprocessor 1210.

The RAM 1230 may be used as a buffer memory, and may store commands, data, and parameters input via the host input/output device 1202. The RAM 1230 may store data and parameters that are input to the nonvolatile memory device 1100 or are output therefrom.

The ECC unit 1240 may be used to detect and/or correct bit errors in the "write data" received from the host and/or "read data" retrieved from the non-volatile memory device 1100. The ECC unit 1240 of FIG. 1 includes an ECC encoder 1241 and an ECC decoder 1242.

The ECC encoder 1241 may be sued to perform an error correction encoding operation of data input via the host input/output device 1202 to generate a codeword to which parity information is added. The codeword may be stored in the nonvolatile memory device 1100.

The ECC decoder 1242 may make error correction decoding on data output from the nonvolatile memory device 1100 to output a direction signal according to whether error correction decoding is successful. Data read from the nonvolatile memory device 1100 may be transferred to the ECC decoder 1242, and the ECC decoder 1242 may bit errors using the parity information. However, if a number of bit errors exceeds a defined limit, the ECC decoder 1242 will generate a fail signal.

The ECC encoder 1241 and the ECC decoder 1242 may perform error correction using coded modulation such as Low Density Parity Check (LDPC) code, BCH code, turbo code, Reed-Solomon code, convolution code, Recursive Systematic Code (RSC), Trellis-Coded Modulation (TCM), Block Coded Modulation (BCM), and/or the like. However, the inventive concept is not limited thereto. The ECC encoder 1241 and the ECC decoder 1242 can be included various circuits, systems, and/or devices to accomplish error correction at a given performance level.

The randomizer 1250 may be used to change a given pattern of input data values into a "randomized data pattern", such that the probability of any one data value (e.g., a "1" or a "0") occurring in the randomized data pattern is equal to the probability of any other data value occurring in the randomized data pattern. As noted above, the provision of a randomized data pattern for input data improves data reliability by providing better immunity to system and environmental influences. One or more examples of the randomizer 1250 will be set forth in some additional detail hereafter.

The seed controller 1260 may be used to generate a seed to be used in initially setting up one or more linear feedback shift registers within the randomizer 1250. In certain embodiments, the seed controller 1260 may perform one or more cyclic shift(s) using a plurality of parameters in order to generate a seed. One or more examples of the seed controller 1260 will be described in some additional detail hereafter.

Figure 2:
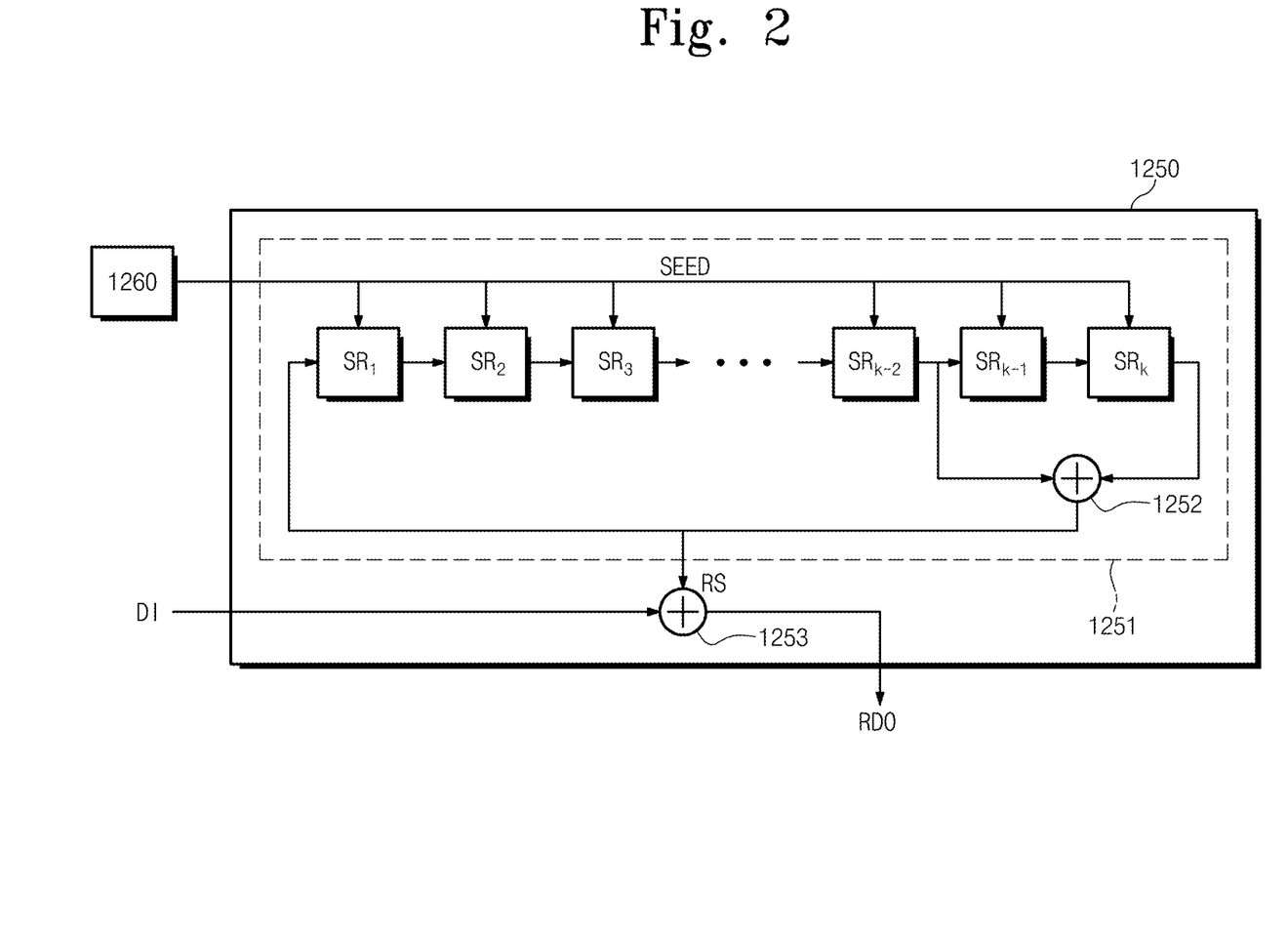
FIG. 2 is a block diagram further illustrating the randomizer of FIG. 1.

FIG. 2 is a block diagram further illustrating in one example the randomizer 1250 of FIG. 1. Referring to FIG. 2, the randomizer 1250 comprises a Random Sequence generator 1251 and a final logic gate 1253.

The random sequence generator 1251 of FIG. 2 may include a plurality of linear feedback shift registers $SR_1$ to $SR_k$ and a first logic gate 1252. Assuming that the number of linear feedback shift registers $SR_1$ to $SR_k$ is "k", a random sequence (RS) may be generated having a period of ($2^k$-1). Herein, the value "k" may be understood as an order of the randomizer 1250. An initial value, or seed, is provided to each one of the linear feedback shift registers $SR_1$ to $SR_k$ by the seed controller 1260.

Referring to FIG. 2, the first logic gate 1252 may be used to generate the random sequence RS by (e.g.,) exclusive ORing (XORing) bits from the linear feedback shift registers $SR_{(k-2)}$ and $SR_k$. The final logic gate 1253 may than be used to convert input data DI to random data RD using the random sequence RS provided by the random sequence generator 1251. For example, the final logic gate 1253 may output random data RD by XORing the random sequence RS with the input data DI.

Hence, the randomizer 1250 may be used to randomize input data DI such that data values of '1' and '0' (assuming binary input data) are probabilistically maintained at a constant frequency. The use of a randomized input data pattern allows improvements in the degree of memory cell integration within the nonvolatile memory 1100 by remediation of the adverse influences typically applied to the constituent memory cells. That is, interference with the stored data states (i.e., programmed threshold voltages for the memory cells) of one or more "victim memory cells" usually varies with the data state and the data state programming of a proximate (e.g., adjacent in a row-wise or columnar direction) "aggressor memory cell". Nonetheless, embodiments of the inventive concept reduce interference by provision of a randomized data pattern for the input data.

However, the improved reliability of nonvolatile memory devices and memory systems according to embodiments of the inventive concept require integrity of the seed value that controls the randomization of the input data by the randomizer 1250. That is, frequent use of the same seed value will diminish the effectiveness of memory cell interference remediation provided by the randomizing of input data by the randomizer 1250. For example, iterative use of a seed makes it difficult to truly "randomize" input data patterns in both the row-wise and columnar directions across the array of nonvolatile memory cells.

In view of this potential problem, embodiments of the inventive concept may be implemented to perform a plurality of cyclic shifts using a plurality of parameters. Thereby, it is possible to prevent a seed from being iteratively used at too high a frequency. Certain embodiments of the inventive concept provide a memory controller configured to provide improved randomization of input data in the row-wise direction and the columnar direction of nonvolatile memory cell arrays.

Figure 3:
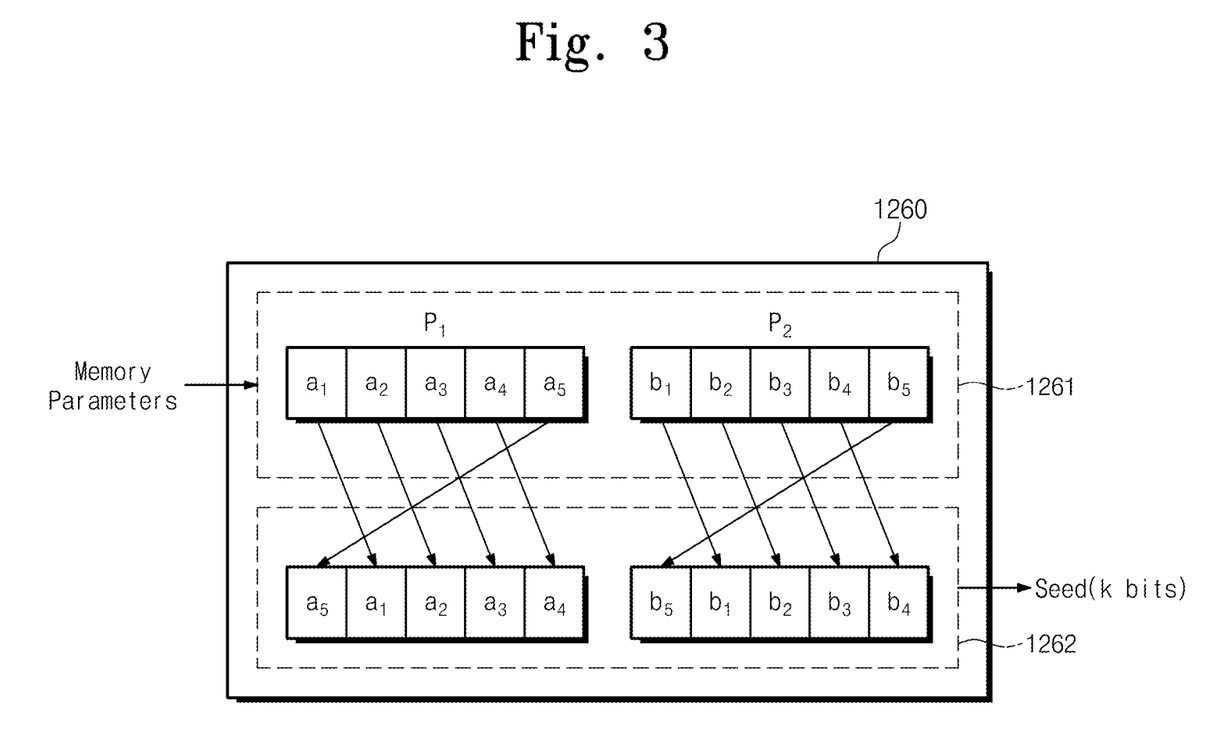
FIG. 3 is a conceptual diagram further describing one possible operating method for the seed controller of FIG. 1 according to an embodiment of the inventive concept.

FIG. 3 is a diagram describing one possible operation for the seed controller 1260 of FIG. 1. Referring to FIG. 3, the seed controller 1260 receives memory parameters that will be used to perform corresponding cyclic shift operations. As a result, the seed controller 1260 may output a k-bit seed. In FIG. 3, a reference numeral 1261 is used to indicate a seed generating block before a cyclic shift operation is performed, and a reference numeral 1262 is used to indicate a seed generating block after the cyclic shift operation is performed.

Referring to FIG. 3, the seed controller 1260 includes a first register block P1 performing first cyclic shift using a first parameter and a second register block P2 performing second cyclic shift using a second parameter. The seed controller 1260 generates a seed using cyclic shift results from the first and second register blocks P1 and P2. The seed generating block 1262 generates the seed including bits corresponding to an order of the randomizer, and then provides the seed to the randomizer 1250.

In the illustrated example of FIG. 3, the first parameter includes an "a-bit" that may be derived from a page address, a block address, an erase count, or a sector number associated with a nonvolatile memory device. Alternately, the first parameter may be obtained using computational sequential of parameters for a plurality of nonvolatile memories in a nonvolatile memory device. For example, the sequential parameters may be different from one another, and may be a parameter obtained by computing a block address and a page address.

The second parameter may include a "b-bit" that may be derived from a page address, a block address, an erase count, or a sector number associated with a nonvolatile memory device. Further, the second parameter can be a parameter obtained by computing sequential parameters of a plurality of nonvolatile memories in a nonvolatile memory device.

The sequential parameters may be different from one another, and may be a parameter obtained by computing a block address and a page address. A sum of the a-bit and b-bit may be used to generate a first seed including bits corresponding to an order of the randomizer. The first parameter may be equal to or different from the second parameter.

Referring to FIG. 3, the seed controller 1260 may perform n-bit cyclic shift, wherein "n" is a natural number. In FIG. 3, 1-bit cyclic shift is illustrated. In case of 1-bit cyclic shift, each of parameter bits may be cyclically shifted to an adjacent location.

Thus, the seed controller 1260 may perform a first cyclic shift operation and a second cyclic shift operation in the same direction. Alternately, the seed controller 1260 may perform the first cyclic shift operation and the second cyclic shift operation in different directions.

Figure 4:
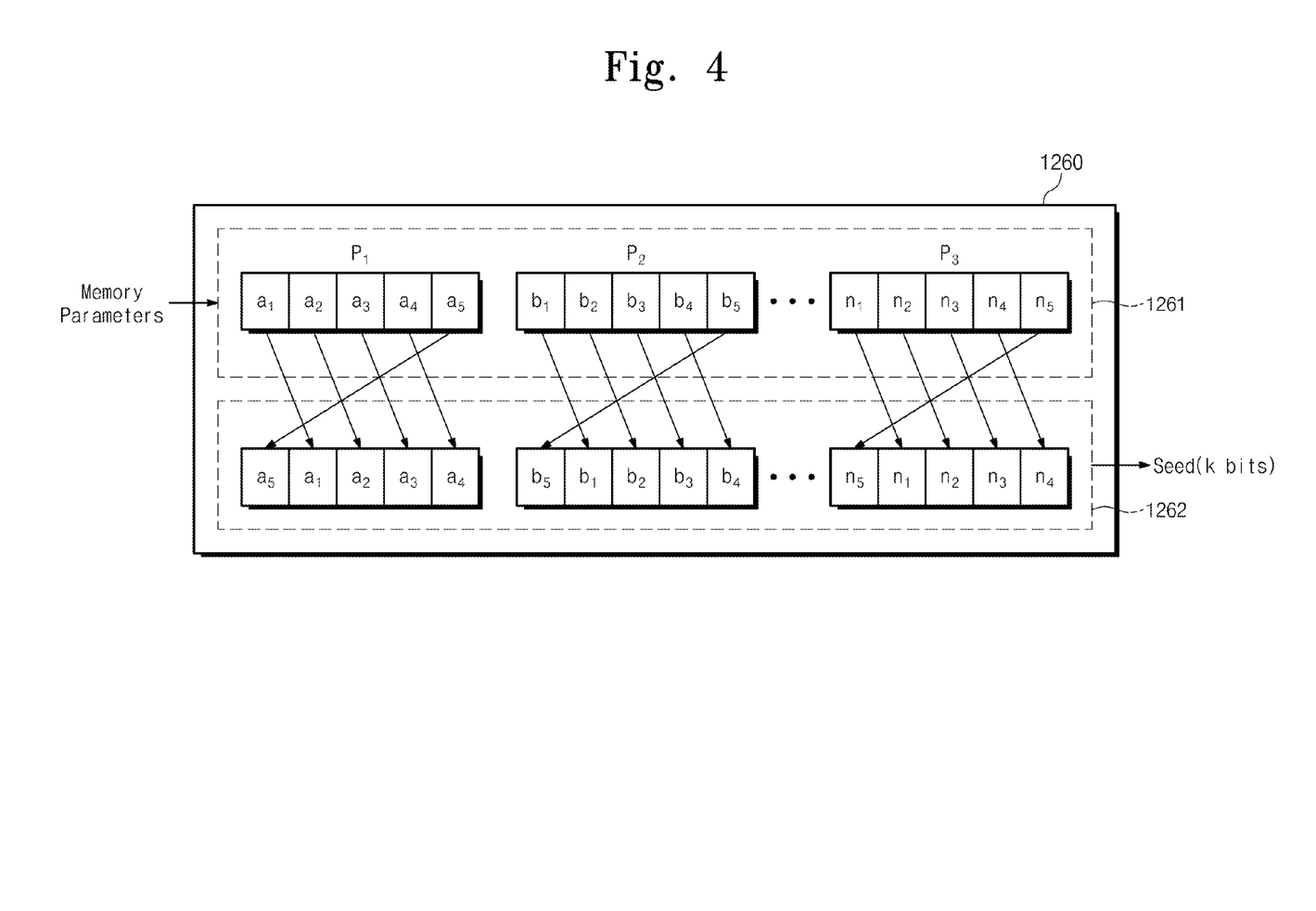
FIG. 4 is a conceptual diagram further describing one possible operating method for the seed controller of FIG. 1 according to another embodiment of the inventive concept.

FIG. 4 is a diagram further illustrating operation of the seed controller 1260 of FIG. 1 according to another embodiment of the inventive concept. Referring to FIG. 4, the seed controller 1260 generates via a cyclic shift operation that is executed using L register blocks $P_1$ to $P_L$. For ease of description, it is assumed that L is 3 in the illustrated example.

The seed controller 1260 may include a first register block $P_1$ performing a first cyclic shift operation using a first parameter, a second register block $P_2$ performing a second cyclic shift operation using a second parameter, and a third register block $P_3$ performing a third cyclic shift operation using a third parameter. Seed generating blocks 1261 and 1262 generate a first seed via the first to third cyclic shift operations, and provide the first seed to the randomizer 1250. The first seed includes k bits corresponding to an order of the randomizer in FIG. 2. The first seed is then loaded to k linear feedback shift registers $SR_1$ to $SR_k$.

The third parameter may be equal to or different from the first and second parameters. The third cyclic shift operation may be performed by an n-bit unit, where "n" is a natural number. For ease of description, a 1-bit cyclic shift is illustrated in FIG. 3. In case of 1-bit cyclic shift, each of parameter bits may be cyclically shifted to an adjacent location.

The seed controller 1260 may perform the first to third cyclic shift operations in the same direction, or in different directions. The third parameter may be a page address, a block address, an erase count, or a sector number associated with a nonvolatile memory device. The third parameter can be a parameter obtained by computing sequential parameters of a plurality of nonvolatile memories in a nonvolatile memory device.

Figure 5:
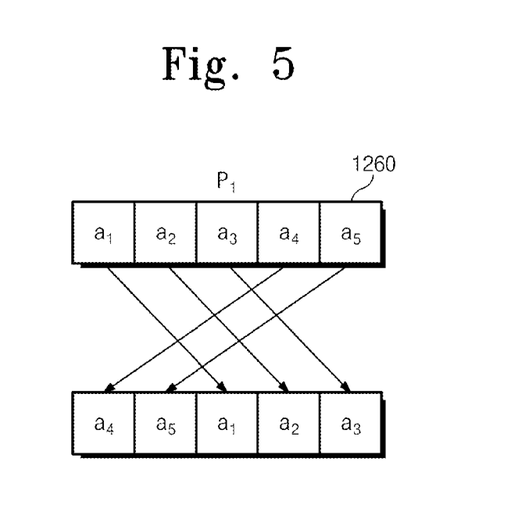
FIG. 5 is a conceptual diagram further describing one possible operating method for the seed controller of FIG. 1 according to still another embodiment of the inventive concept.

FIG. 5 is a diagram further illustrating an operation of the seed controller 1260 of FIG. 1 according to still another embodiment of the inventive concept. Referring to FIG. 5, the seed controller 1260 may perform an n-bit cyclic shift operation using a first parameter. In FIG. 5, a case is illustrated wherein a first register block $P_1$ cyclically shifts the first parameter by a 2-bit unit. The first parameter may include a-bit.

For ease of description, only the first parameter is illustrated. But, the 2-bit cyclic shift operation may be applied to the second parameter or third parameter. That is, a second register block cyclically shifts the second parameter by a 2-bit unit, and a third register block cyclically shifts the third parameter by a 2-bit unit.

Figure 6:
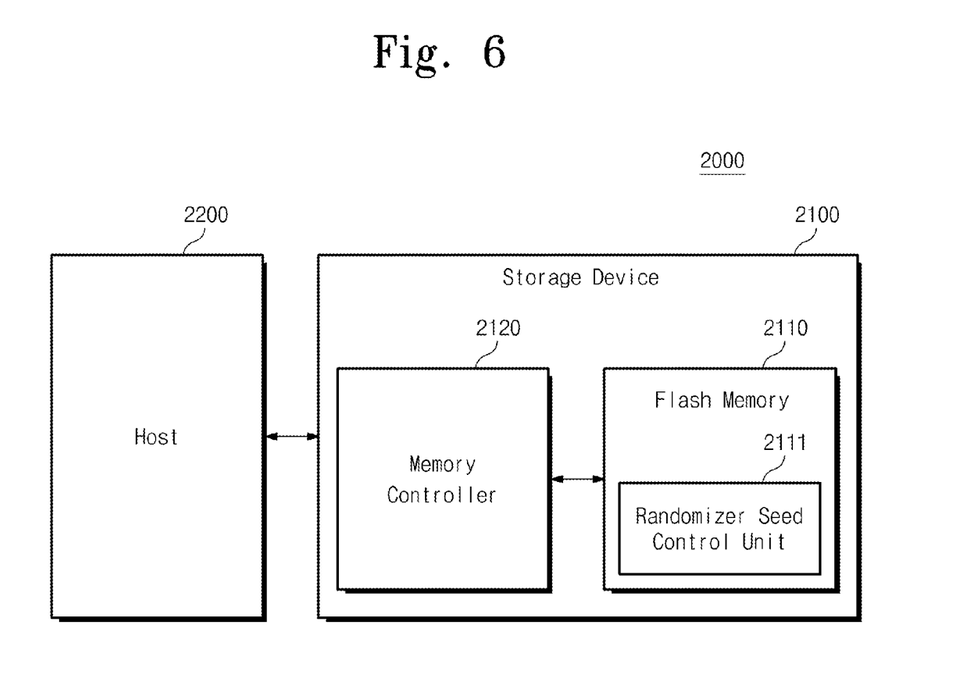
FIG. 6 is a block diagram illustrating an electronic device incorporating a memory system according to an embodiment of the inventive concept.

FIG. 6 is a block diagram illustrating an electronic device to which a memory system according to the inventive concept may be applied. Referring to FIG. 6, an electronic device 2000 may include a host 2200 and a storage device 2100.

The host 2200 may be a device such as a personal computer, a digital camera, a camcorder, a handheld phone, an MP3 player, a PMP, a PSP, a PDA, or the like. The storage device 2100 may include a memory controller 2120 and a flash memory 2110. The memory controller 2120 may correspond to a memory controller 1200 in FIG. 1, and may control the flash memory 2110 overall. The flash memory 2110 may include a randomizer seed control unit 2111.

Figure 7:
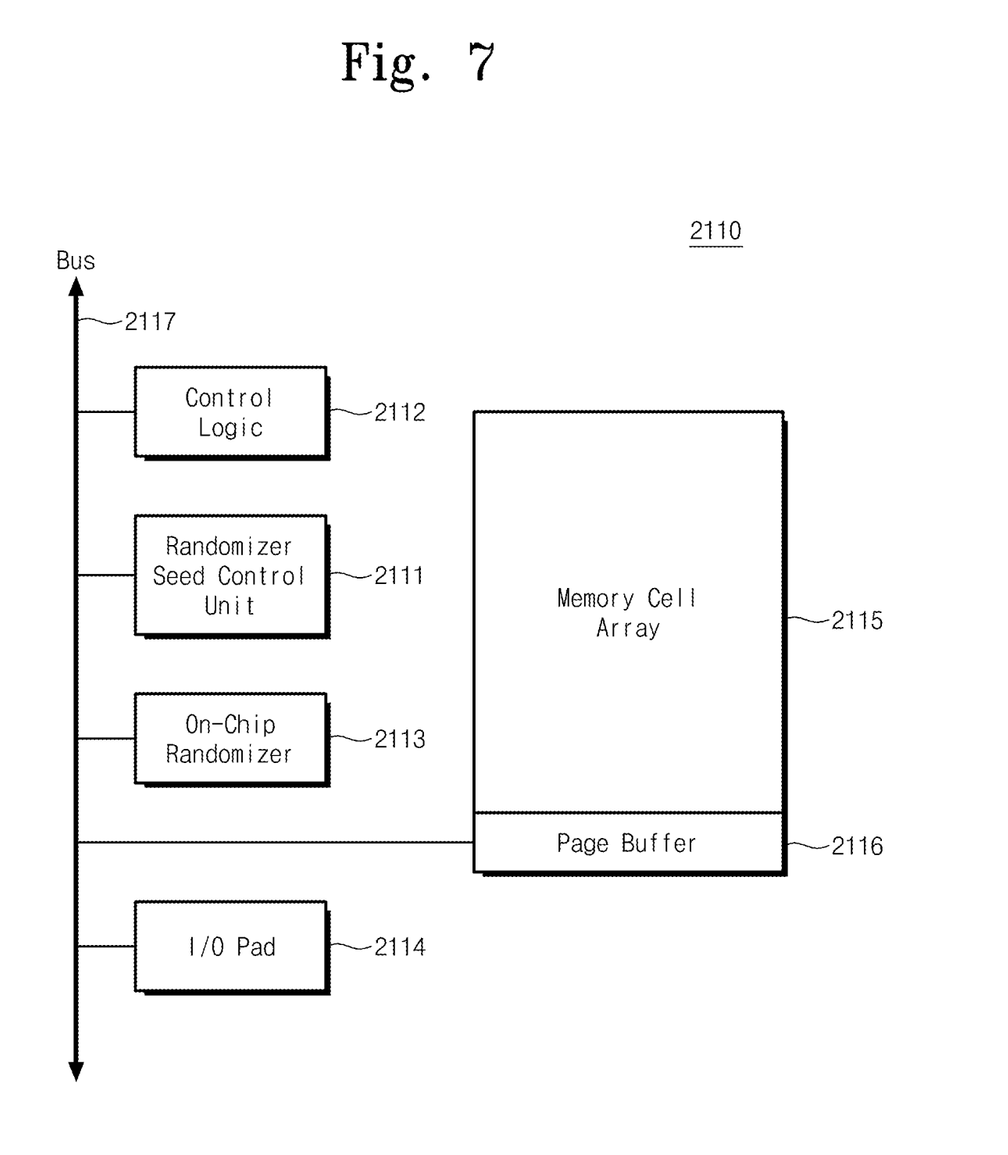
FIG. 7 is a block diagram further illustrating the flash memory of FIG. 6.

FIG. 7 is a block diagram further illustrating the flash memory 2110 of FIG. 6. Referring to FIG. 7, a flash memory 2110 may include a memory cell array 2115, a page buffer circuit 2116, an input/output pad 2114, an on-chip randomizer 2113, a randomizer seed control unit 2111, and control logic 2112. The memory cell array 2115 may include memory cells arranged at intersection of word lines and bit lines. A bus 2117 may electrically connect constituent elements 2111, 2112, 2113, 2114, 2115, and 2116 of the flash memory 2110.

The memory cell array 2115 may include a plurality of word lines and a plurality of bit lines, and each memory cell may store 1-bit data or M-bit data (M being a natural number of 2 or more). Each memory cell may be formed of a memory cell having a charge storage layer such as a floating gate or a charge trap layer or a memory cell having a variable resistance element. The memory cell array 2115 may be formed to have a single-layer array structure (called a two-dimensional array structure) or a multi-layer array structure (called a three-dimensional array structure).

The control logic 2112 may control an overall operation of the flash memory 2115. If a command CMD is received from a memory controller 2120, the control logic 2112 may decode the command CMD, and may control the flash memory 2110 to perform an operation of the decoded command, for example, a program, read, or erase operation.

The page buffer circuit 2116 may be controlled by the control logic 2112, and may operate as a sense amplifier or a write driver according to a mode of operation, for example, a read operation or a program operation. For example, during a read operation, the page buffer circuit 2116 may operate as a sense amplifier that sense data read from at least one memory cell connected to at least one selected word line and at least one selected bit line.

During a program operation, the page buffer circuit 2116 may operate as a write driver that writes data in at least one memory cell connected to at least one selected word line and at least one selected bit line. The page buffer circuit 2116 may be connected to at least one bit line. The page buffer circuit 2116 may store program data or read data during a program operation or a read operation.

The input/output pad 2114 may provide a data input/output path between an external device (e.g., a memory controller 2120) and the flash memory 2110.

As described in relation to FIG. 1, the on-chip randomizer 2113 may randomize data input from an external device at programming such that data of '1' and data of '0' are probabilistically constantly maintained. As described in relation to FIG. 2, the on-chip randomizer 2113 may include a random sequence generator and a logic gate.

The on-chip randomizer 2113 may include a plurality of linear feedback shift registers, and an initial value called a seed may be stored in the plurality of linear feedback shift registers. The on-chip randomizer 2113 may generate a random sequence using a seed, and may randomize input data using the random sequence.

The randomizer seed control unit 2111 may generate a seed by performing cyclic shift using a plurality of parameters. As described in relation to FIG. 3, the randomizer seed control unit 2111 may include a first register block performing first cyclic shift using a first parameter and a second register block performing second cyclic shift using a second parameter.

The randomizer seed control unit 2111 may generate a seed using cyclic shift results of the first and second register blocks to provide it to the on-chip randomizer 2113. The randomizer seed control unit 2111 may generate a seed initially stored in linear feedback shift registers of the on-chip randomizer 2113 to provide it to the on-chip randomizer 2113.

The seed may include bits corresponding to an order of a randomizer. Each of the first and second parameters may be a page address, a block address, an erase count, or a sector number associated with a nonvolatile memory device. Further, each of the first and second parameters can be a parameter obtained by computing sequential parameters of a plurality of nonvolatile memories in a nonvolatile memory device. First and second cyclic shift operations may be performed by an n-bit unit. The first cyclic shift operation and the second cyclic shift operation may be performed in the same direction. In other example embodiments, the first cyclic shift operation and the second cyclic shift operation may be performed in different directions.

Figure 8:
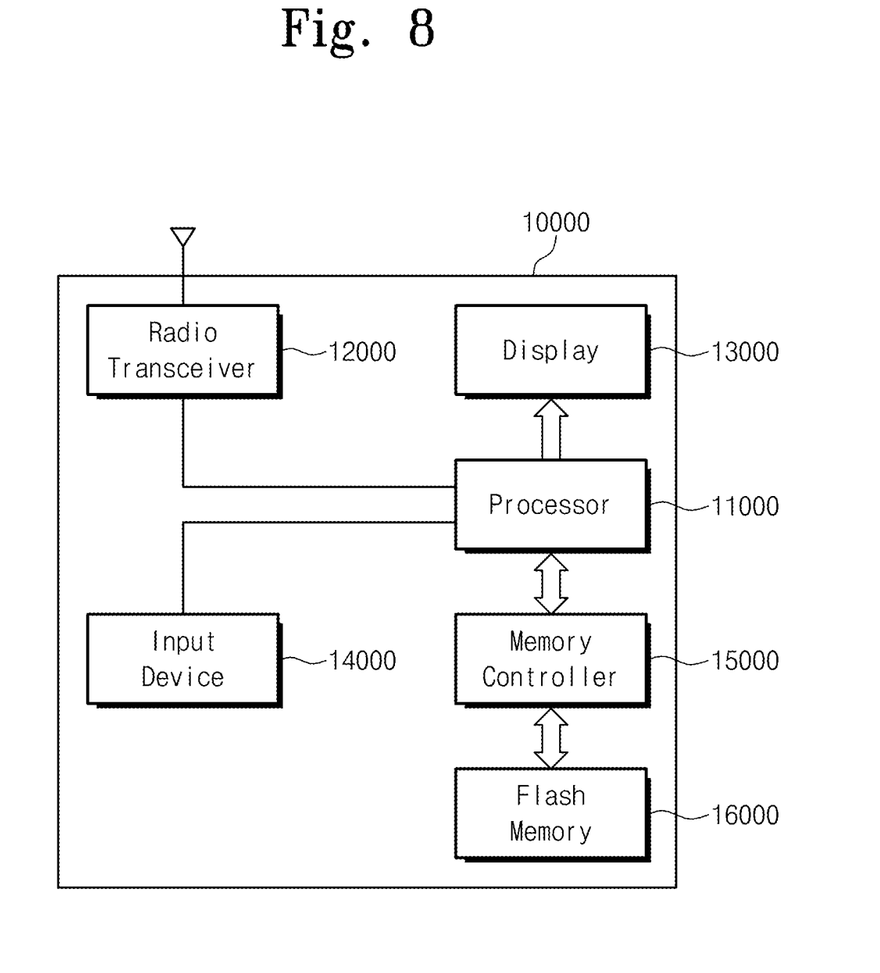
FIGS. 8, 9, 10, 11, and 12 are block diagrams respectively illustrating electronic devices and systems that may incorporate a memory controller and/or a nonvolatile memory device according to an embodiment of the inventive concept.

FIG. 8 is a block diagram illustrating an electronic device including a memory controller and a nonvolatile memory device according to an embodiment of the inventive concept.

Referring to FIG. 8, an electronic device 10000 such as a cellular phone, a smart phone, or a tablet PC may include a nonvolatile memory device 16000 formed of a flash memory device and a memory controller 15000 controlling an operation of the nonvolatile memory device 16000.

The nonvolatile memory device 16000 may be a nonvolatile memory device described in FIGS. 1 and 7. The nonvolatile memory device 16000 may store random data.

The memory controller 15000 may be a memory controller including a seed controller 1260 illustrated in FIG. 1. The memory controller 15000 may include a first register block performing first cyclic shift using a first parameter, a second register block performing second cyclic shift using a second parameter, and a seed generating block generating a seed using cyclic shift results of the first and second register blocks. The memory controller 15000 may randomize original data using the seed to output random data.

The memory controller 15000 may be controlled by a processor 11000 controlling an overall operation of the electronic device 10000.

Data stored in the nonvolatile memory device 16000 may be displayed via a display 13000 under the control of the memory controller 15000 that operates in response to the control of a processor 11000.

A radio transceiver 12000 may transmit and receive a radio signal via an antenna. For example, the radio transceiver 12000 may convert a radio signal received via the antenna to a signal suitable for the processor 11000 to process. The processor 11000 may process a signal output from the radio transceiver 12000, and the processed signal may be stored in the nonvolatile memory device 16000 via the memory controller 15000 or displayed via the display 13000.

The radio transceiver 12000 may convert a signal from the processor 11000 to a radio signal to output it to an external device via the antenna.

An input device 14000 may be a device capable of receiving a control signal for controlling an operation of the processor 11000 or data to be processed by the processor 11000. The input device 14000 may include a pointing device such as a touch pad or a computer mouse, a keypad, or a keyboard.

The processor 11000 may control the display 13000 so as to display data output from the nonvolatile memory device 16000, a radio signal from the radio transceiver 12000, or data from the input device 14000.

Figure 9:
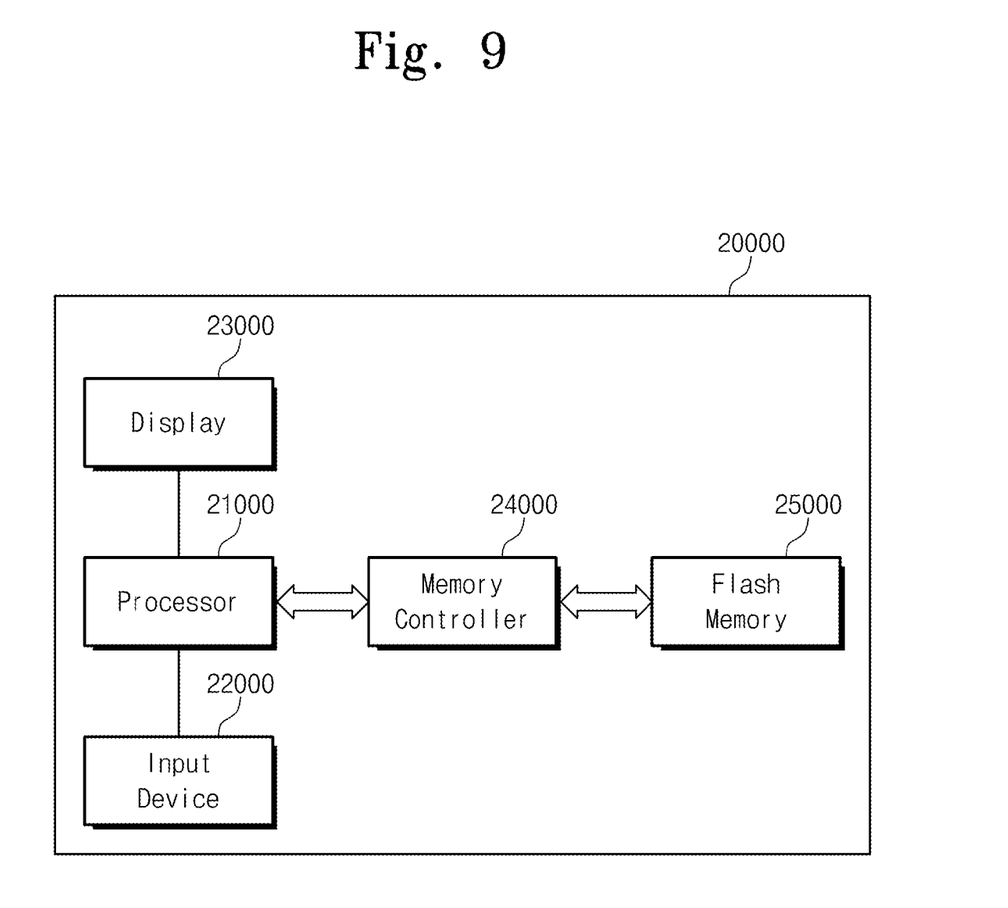

FIG. 9 is a block diagram illustrating an electronic device including a memory controller and a nonvolatile memory device according to another embodiment of the inventive concept.

Referring to FIG. 9, an electronic device 20000 may be a data processing device such as a personal computer, a tablet computer, a net-book, an e-reader, a PDA, a PMP, an MP3 player, or an MP4 player, and may include a nonvolatile memory device 25000 formed of a flash memory device and a memory controller 24000 controlling an operation of the nonvolatile memory device 25000.

The nonvolatile memory device 25000 may be a nonvolatile memory device described in FIGS. 1 and 7. The nonvolatile memory device 25000 may store random data.

The memory controller 24000 may be a memory controller including a seed controller 1260 illustrated in FIG. 1. The memory controller 24000 may include a first register block performing first cyclic shift using a first parameter, a second register block performing second cyclic shift using a second parameter, and a seed generating block generating a seed using cyclic shift results of the first and second register blocks. The memory controller 24000 may randomize original data using the seed to output random data.

The electronic device 20000 may include a processor 21000 controlling an overall operation of the electronic device 20000. The memory controller 24000 may be controlled by the processor 21000.

The processor 21000 may display data, stored in a nonvolatile memory device, via a display according to an input signal generated by an input device 22000. For example, the input device 22000 may be formed of a pointing device such as a touch pad or a computer mouse, a keypad, or a keyboard.

Figure 10:
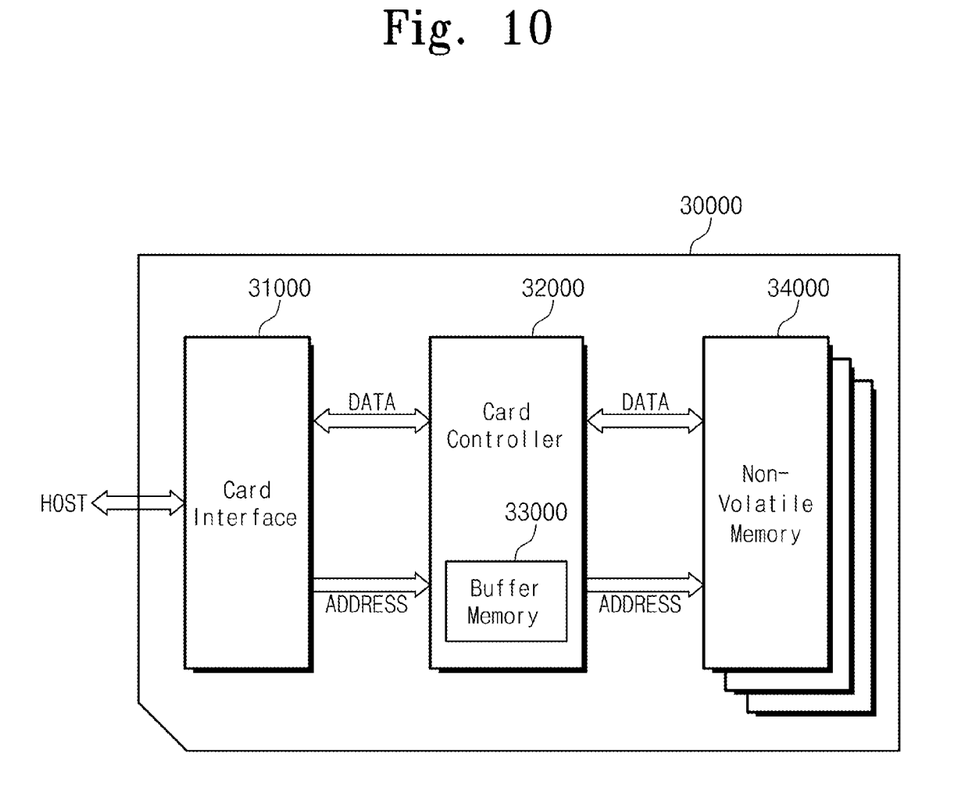

FIG. 10 is a block diagram illustrating an electronic device including a nonvolatile memory device according to still another embodiment of the inventive concept.

Referring to FIG. 10, an electronic device 30000 may include a card interface 31000, a card controller 32000, and a nonvolatile memory device 34000, for example, a flash memory device.

The electronic device 30000 may exchange data with a host via card interface 31000. In example embodiments, the card interface 31000 may be an SD card interface or an MMC interface. However, the inventive concept is not limited thereto. The card interface 31000 may exchange data between the host and the card controller 32000 according to the communication protocol of the host capable of communicating with the electronic device 30000.

The card controller 32000 may control an overall operation of the electronic device 30000, and may control data exchange between the card interface 31000 and the nonvolatile memory device 34000. A buffer memory 33000 of the card controller 32000 may buffer data transferred between the card interface 31000 and the nonvolatile memory device 34000.

The card controller 32000 may be connected to the card interface 31000 and the nonvolatile memory device 34000 via a data bus and an address bus. In example embodiments, the card controller 32000 may receive an address of data to be read or written via the address bus from the card interface 31000 to send it to the nonvolatile memory device 34000.

The card controller 32000 may receive or send data to be read or to be written via the data bus connected to the card interface 31000 or the nonvolatile memory device 34000.

The nonvolatile memory device 34000 may be a nonvolatile memory device described in FIGS. 1 and 7. The nonvolatile memory device 34000 may store random data.

The card controller 32000 may be a memory controller including a seed controller 1260 illustrated in FIG. 1. The card controller 32000 may include a first register block performing first cyclic shift using a first parameter, a second register block performing second cyclic shift using a second parameter, and a seed generating block generating a seed using cyclic shift results of the first and second register blocks. The card controller 32000 may randomize original data using the seed to output random data.

When the electronic device 30000 in FIG. 10 is connected to a host such as a PC, a tablet PC, a digital camera, a digital audio player, a cellular phone, a console video game hardware, or a digital set-top box, the host may send or receive data stored in the nonvolatile memory device 34000 via the card interface 31000 and the card controller 32000.

Figure 11:
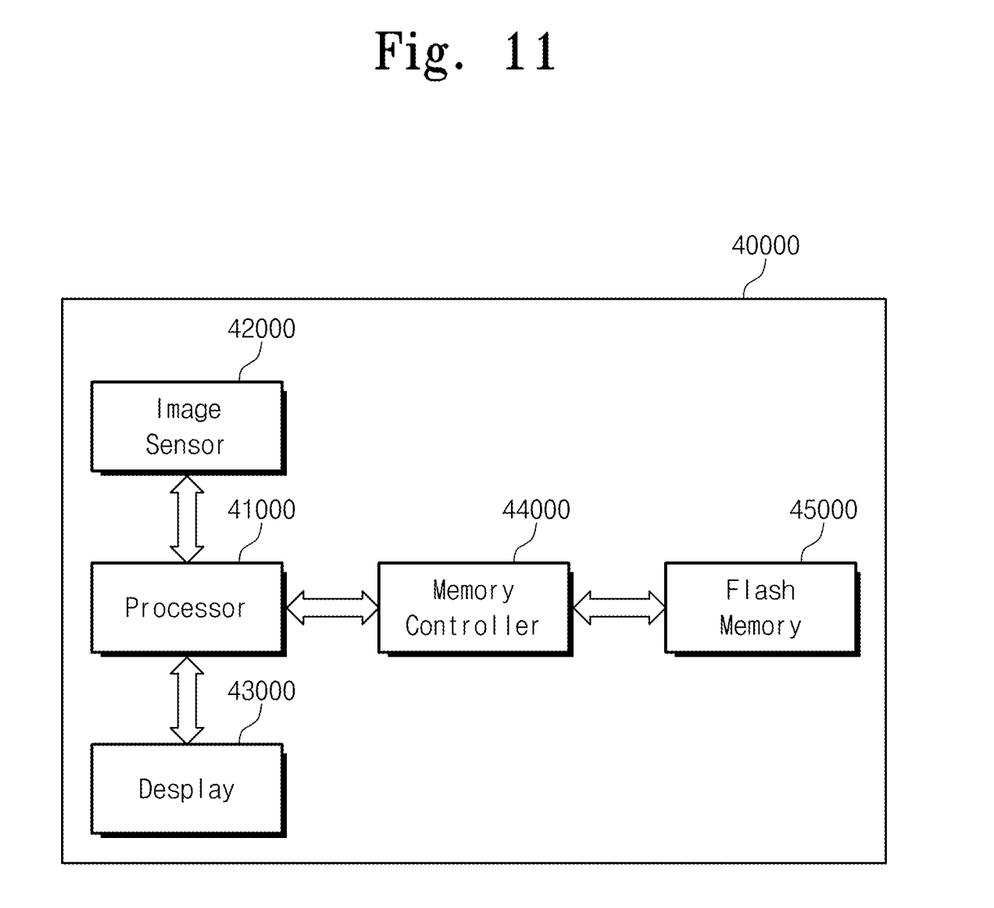

FIG. 11 is a block diagram illustrating an electronic device including a memory controller and a nonvolatile memory device according to still another embodiment of the inventive concept.

Referring to FIG. 11, an electronic device 40000 may include a nonvolatile memory device 45000 such as a flash memory device, a memory controller 44000 controlling a data processing operation of the nonvolatile memory device 45000, and a processor 41000 controlling an overall operation of the electronic device 40000.

The nonvolatile memory device 45000 may be a nonvolatile memory device described in FIGS. 1 and 7. The nonvolatile memory device 45000 may store random data.

The memory controller 44000 may be a memory controller including a seed controller 1260 illustrated in FIG. 1. The memory controller 44000 may include a first register block performing first cyclic shift using a first parameter, a second register block performing second cyclic shift using a second parameter, and a seed generating block generating a seed using cyclic shift results of the first and second register blocks. The memory controller 44000 may randomize original data using the seed to output random data.

An image sensor 42000 of the electronic device 40000 may convert an optical signal to a digital signal, and the digital signal may be stored in the nonvolatile memory device 45000 or displayed via a display 43000 under the control of the processor 41000.

Figure 12:
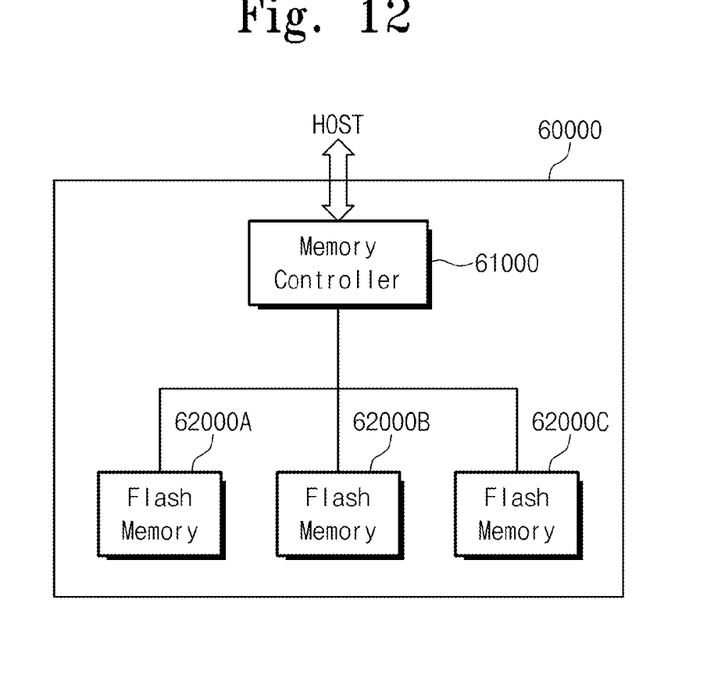

FIG. 12 is a block diagram illustrating an electronic device including a memory controller and nonvolatile memory devices according to still another embodiment of the inventive concept.

Referring to FIG. 12, an electronic device 60000 may be implemented by a data storage device such as a Solid State Drive (SSD).

The electronic device 60000 may include a plurality of nonvolatile memory devices 62000A, 62000B, and 62000C and a memory controller 61000 controlling a data processing operation of each of the plurality of nonvolatile memory devices 62000A, 62000B, and 62000C.

The electronic device 60000 may be implemented by a memory system or a memory module.

Each of the nonvolatile memory devices 62000A, 62000B, and 62000C may be a nonvolatile memory device described in FIGS. 1 and 7. Each of the nonvolatile memory devices 62000A, 62000B, and 62000C may store random data.

The memory controller 61000 may be a memory controller including a seed controller 1260 illustrated in FIG. 1. The memory controller 61000 may include a first register block performing first cyclic shift using a first parameter, a second register block performing second cyclic shift using a second parameter, and a seed generating block generating a seed using cyclic shift results of the first and second register blocks. The memory controller 61000 may randomize original data using the seed to output random data.

In example embodiments, the memory controller 61000 may be provided at the interior or exterior of the electronic device 60000.

Figure 13:
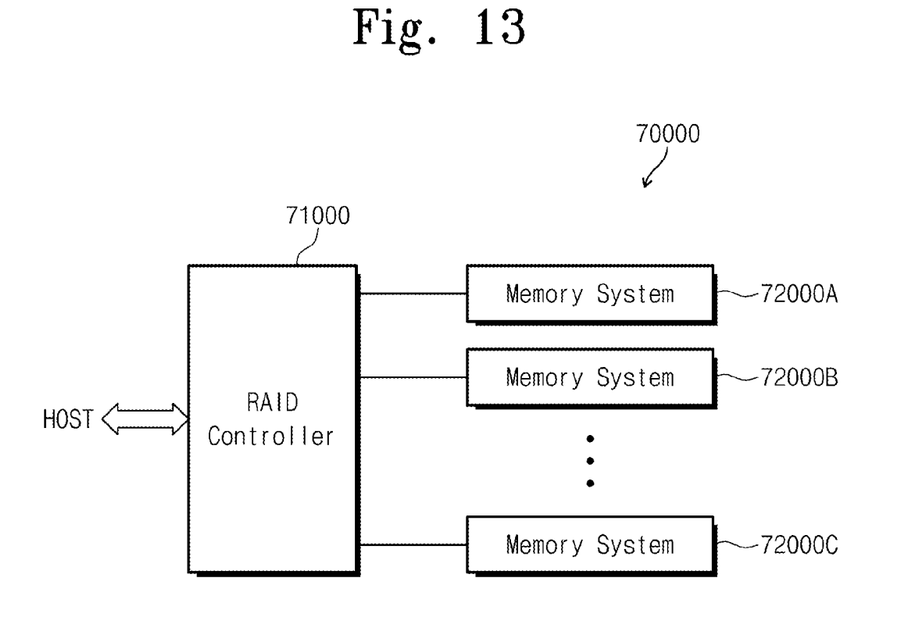
FIG. 13 is a block diagram further illustrating the data processing system of FIG. 12.

FIG. 13 is a block diagram further illustrating the data processing system of FIG. 12. Referring to FIGS. 12 and 13, a data storage device 70000 may be implemented by a RAID (Redundant Array of Independent Disks) system, and may include a RAID controller 71000 and a plurality of memory systems 72000A to 72000C.

The memory systems 72000A to 72000C may constitute a RAID array. The data storage device 70000 may be implemented by a personal computer or an SSD.

During a program operation, the RAID controller 71000 may output program data from a host to one of the memory systems 72000A to 72000C according to a RAID level, selected depending on RAID level information from the host, from among a plurality of RAID levels.

During a read operation, the RAID controller 71000 may provide the host with data read from one of the memory systems 72000A to 72000C according to a RAID level, selected depending on RAID level information from the host, from among a plurality of RAID levels.

A memory controller of each of the memory systems 72000A to 72000C may be a memory controller including a seed controller 1260 in FIG. 1. The memory controller may include a first register block performing first cyclic shift using a first parameter, a second register block performing second cyclic shift using a second parameter, and a seed generating block generating a seed using cyclic shift results of the first and second register blocks. The memory controller may randomize original data using the seed to output random data.

The above-disclosed subject matter is to be considered illustrative, and not restrictive, and the appended claims are intended to cover all such modifications, enhancements, and other embodiments, which fall within the scope of the attached claims. Thus, to the maximum extent allowed by law, the scope is to be determined by the broadest permissible interpretation of the following claims and their equivalents, and shall not be restricted or limited by the foregoing detailed description.

What is claimed is:

1. In a memory system including a memory controller and a nonvolatile memory device, the memory controller comprises:
   a randomizer that receives a non-random input data pattern and converts the non-random input data pattern into a random input data pattern using a seed, wherein the randomizer comprises a plurality of linear feedback shift registers each receiving the seed; and
   a seed controller configured to provide the seed to the randomizer, the seed controller comprises:
      a first register block configured to receive a first parameter and perform a first cyclic shift operation of the received first parameter to generate a first cyclic shift result;
      a second register block configured to receive a second parameter and perform a second cyclic shift operation of the received second parameter to generate a second cyclic shift result; and
      a seed generating block configured to generate the seed using the first and second cyclic shift results,
      wherein each of the first parameter and the second parameter is derived from at least one of a page address, a block address, an erase count, and a sector number for the nonvolatile memory device or is derived by computing a plurality of sequential parameters related to the nonvolatile memory device,
      wherein the first parameters include a-bits and the second parameters include b-bits, wherein a and b are natural numbers,
      wherein the first and second cyclic shift operations are operations for cyclic shifting the a-bits and the b-bits to respective different locations, respectively.

2. The memory controller of claim 1, wherein the first parameter is different from the second parameter.

3. The memory controller of claim 1, wherein the first cyclic shift operation is performed using an n-bit unit, wherein n is a natural number.

4. The memory controller of claim 1, wherein the second cyclic shift operation is performed using an n-bit unit, wherein n is a natural number.

5. The memory controller of claim 1, wherein the first and second cyclic shift operations are performed in different directions.

6. The memory controller of claim 1, wherein the first and second cyclic shift operations are performed in the same direction.

7. The memory controller of claim 1, wherein the seed includes binary data bits equal in number to the plurality of linear feedback shift registers.

8. The memory controller of claim 1, wherein a sum of the a-bits and the b-bits includes binary data bits equal in number to the plurality of linear feedback shift registers.

9. The memory controller of claim 1, wherein the plurality of sequential parameters related to the nonvolatile memory device are different from one another.

10. The memory controller of claim 9, wherein the second parameter is derived from at least one of a page address, a block address, an erase count, and a sector number for the nonvolatile memory device.

11. The memory controller of claim 10, wherein the second parameter is derived by computing a plurality of sequential parameters of the nonvolatile memory device.

12. The memory controller of claim 11, wherein the plurality of sequential parameters related to the nonvolatile memory device are different from one another.

13. A memory system comprising: a nonvolatile memory device; and a memory controller that receives non-random pattern input data from a host, generates random pattern input data from the non-random pattern input data, and stores the non-random pattern input data in the nonvolatile memory device, wherein the memory controller comprises: a randomizer that converts the non-random input data pattern into the random input data pattern using a seed and comprises a plurality of linear feedback shift registers each receiving the seed; and a seed controller that provides the seed and comprises: a first register block configured to receive a first parameter and perform a first cyclic shift operation of the first parameter related to the nonvolatile memory device to generate a first cyclic shift result; a second register block configured to receive a second parameter and perform a second cyclic shift operation of the second parameter related to the nonvolatile memory device to generate a second cyclic shift result; and a seed generating block configured to generate the seed from the first and second cyclic shift results, wherein the first and second cyclic shift operations shift bits of the first and second parameters to respective different locations; wherein the first parameter and the second parameter are respectively derived from at least one of a page address, a block address, an erase count, and a sector number for the nonvolatile memory device.

14. The memory system of claim 13, wherein the first parameter and the second parameter are respectively derived by computing a plurality of sequential parameters related to the nonvolatile memory device.

15. The memory system of claim 13, wherein the first parameter is different from the second parameter.

16. The memory system of claim 14, wherein the first parameter is different from the second parameter.

\* \* \* \* \*